US006808991B1

(12) United States Patent
Tung

(10) Patent No.: US 6,808,991 B1
(45) Date of Patent: Oct. 26, 2004

(54) METHOD FOR FORMING TWIN BIT CELL FLASH MEMORY

(75) Inventor: Ke-Wei Tung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/717,155

(22) Filed: Nov. 19, 2003

(51) Int. Cl.[7] .......................................... H01L 21/8234
(52) U.S. Cl. ...................... 438/275; 438/288; 438/261; 438/266
(58) Field of Search ................................ 438/275–278, 438/288, 257–266

(56) References Cited

U.S. PATENT DOCUMENTS

| 6,011,725 | A | | 1/2000 | Eitan | |
|---|---|---|---|---|---|
| 6,051,470 | A | | 4/2000 | An et al. | |
| 6,376,308 | B1 | * | 4/2002 | Wang et al. | 438/261 |
| 6,461,949 | B1 | * | 10/2002 | Chang et al. | 438/585 |
| 6,518,103 | B1 | * | 2/2003 | Lai | 438/150 |
| 6,538,292 | B2 | | 3/2003 | Chang et al. | |
| 2003/0040152 | A1 | * | 2/2003 | Liu et al. | 438/239 |

* cited by examiner

Primary Examiner—Jack Chen
(74) Attorney, Agent, or Firm—Warren S. Wolfeld; Haynes Beffel & Wolfeld LLP

(57) ABSTRACT

Roughly described, therefore, in accordance with a preferred embodiment of the present invention, a method is provided for fabricating an N-bit memory device with self-aligned buried diffuision implants and two isolated ONO segments in one cell. The method includes the steps of forming an ONO layer on a substrate, depositing a polysilicon layer, patterning the polysilicon layer, implanting barrier diffusion, trimming the photoresist layer on the polysilicon layer, etching the polysilicon layer by using the trimmed photoresist layer as mask, then removing the photoresist. After removing the photoresist, a nitride layer is filled in the patterned polysilicon layer openings. The etching steps are preformed by using the nitride layer as a mask. The polysilicon layer and part of the ONO layer are removed, and the gate oxide layer is exposed. Two isolated ONO segments are formed by these etching steps. A polysilicon gate is then formed on the gate oxide layer.

16 Claims, 4 Drawing Sheets

METHOD FOR FORMING TWIN BIT CELL FLASH MEMORY

FIELD OF THE INVENTION

The present invention relates to a method for manufacturig a flash memory device, and more particularly to a method of fabricating a nitride read only memory with dual oxide-nitride-oxide (ONO) gate segments and two bits per cells.

BACKGROUND OF THE INVENTION

Flash memory devices are used extensively for computer external storage. One of the goals in manufacturing flash memory is to store a maximum amount of information using a minimum amount of semiconductor surface area. Another goal of flash memory fabrication is use of a simple, inexpensive, yet high yield process. Many previous methods for reducing device size add too much complexity and cost. One relatively recent technique stores two bits in one cell for the purpose for reducing device size. Nitride read only memory (also called N-bit) cells can be used to accomplish this technique.

FIG. 1 illustrates an example prior art Nitride dual bit cell. As illustrated, two separately chargeable areas 100 and 101 are found within a nitride layer 102 formed in an oxide 103-nitride-oxide 104 (ONO) sandwich underneath a polysilicon layer 105. However, some leakage occurs between the first and second bit areas through the Nitride 102. When the first bit area 100 is charged, electrons leak through nitride 102 to second bit area 101. The threshold voltage in second bit area 101 can be influenced by the leaked charge, and the data stored in the second bit could be lost. This problem in dual bit cells is sometimes known as the second bit effect.

In view of the drawbacks of the prior method, it is necessary to provide a method that can reduce the cost and complexity in flash memory fabrication and prevent the problem of second bit effect of N-bit memory.

SUMMARY OF THE INVENTION

It is an objective of the present invention to provide a method of fabricating flash memory cells with twin bit cells, and reduce the problem of the second bit effect.

It is another object of this invention to reduce the cost and complexity in a fabrication process by self-aligning the buried diffusion implant region and the ONO segment in one process.

Roughly described, therefore, in accordance with a preferred embodiment of the present invention, a method is provided for fabricating an N-bit memory device with self-aligned buried diffusion implants and two isolated ONO segments in one cell. The method includes the steps of forming an ONO layer on a substrate, depositing a polysilicon layer, patterning the polysilicon layer, implanting barrier diffusion, trimming the photoresist layer on the polysilicon layer, etching the polysilicon layer by using the trimmed photoresist layer as mask, then removing the photoresist. After removing the photoresist, a nitride layer is filled in the patterned polysilicon layer openings. The etching steps are preformed by using the nitride layer as a mask. The polysilicon layer and part of the ONO layer are removed, and the gate oxide layer is exposed. Two isolated ONO segments are formed by these etching steps. A polysilicon gate is then formed on the gate oxide layer.

The embodiment uses photoresist trimming and a polysilicon hardmask method to self-align buried diffusion implant regions and to slice ONO segments. Hence, two ONO segments can be read and be programmed independently to form a twin bit cell structure. The problem of second bit effect of N-bit in the prior art thus can be reduced.

BRIEF DESCRIPTION OF THE DRAWINGS

The present invention will be understood and appreciated more fully from the following detailed description taken in conjunction with the appended drawings in which.

DETAILED DESCRIPTION

Figure 1:
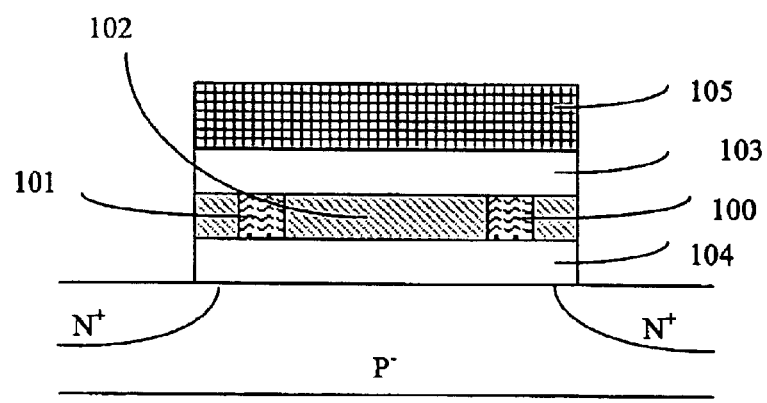
FIG. 1 is a schematic illustration of a prior art dual bit N-bit cell.
Figure 2:
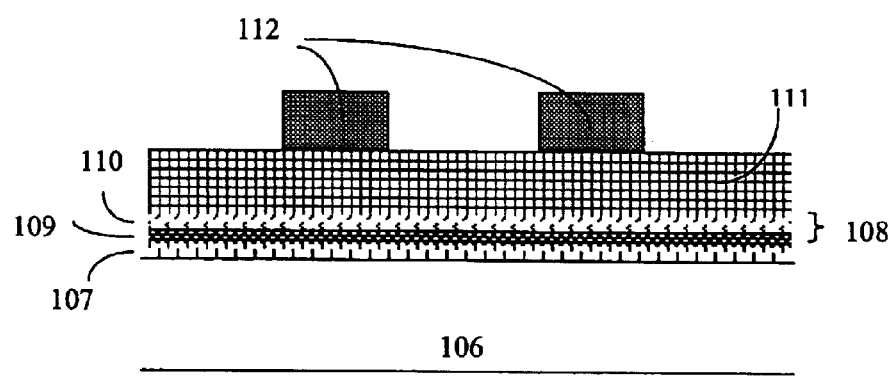
FIG. 2 shows a semiconductor substrate including a gate oxide layer, a oxide-nitride composite layer, a polysilicon layer and a patterned photoresist layer.

It is to be understood and appreciated that the process steps and structures described below do not cover a complete process flow for the manufacture of the flash memory device. The present invention can be practiced in conjunction with various integrated circuit fabrication techniques that are used in the art, and only so much of the commonly practiced process steps are described herein as are necessary to support the claims and provide an understanding of the invention.

Reference is now made to FIGS. 2 to 10, which illustrate an embodiment of the fabrication method. In a preferred embodiment of the present invention, the substrate 106 dopant can be either an n-type or a p-type impurity, and is preferably p-type boron with a resistance in the range of 8 to 12 O/cm$^2$. In this preferred embodiment, a p-type boron impurity is used. Next, a dielectric layer 107, which is used as a thin tunnel layer and is preferably an oxide layer, is grown over the substrate typically to a thickness of between 40 Å and 200 Å by a conventional dry oxidation method. A typical oxidation temperature is about 800° C., but it can vary between 750-1000° C. A preferred thickness of the dielectric layer is 50 Å. Then an insulating composite layer 108, which is preferably a nitride layer 109 underlying an oxide layer 10, is formed over the semiconductor substrate 106. The nitride layer 109 thickness is in the range of 40 Å to 200 Å with a preferred thickness of 70 Å. The top oxide layer 110 is preferably formed of a thickness about 60 Å to 120 Å. Then a first sacrificial layer 111, which is preferably a polysilicon layer, is formed on the surface of the composite layer 108. Low-pressure chemical vapor deposition (LPCVD) is used to deposit this doped polysilicon layer or doped amorphous silicon layer with a thickness of 200 Å to 3000 Å. In this preferred embodiment, the first sacrificial layer is 1200 Å thick. Then a protective patterning layer 112, which is preferably a photoresist layer, is formed on the surface of the first sacrificial layer 111 and patterned.

Figure 3:
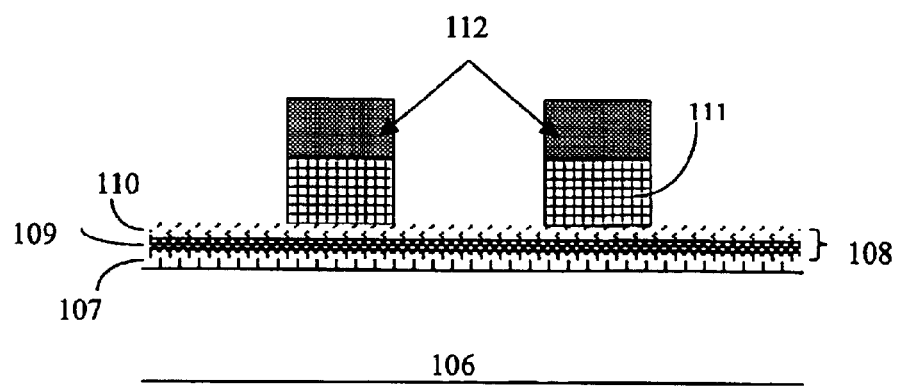
FIG. 3 shows a result of etching the polysilicon layer.
Figure 4:
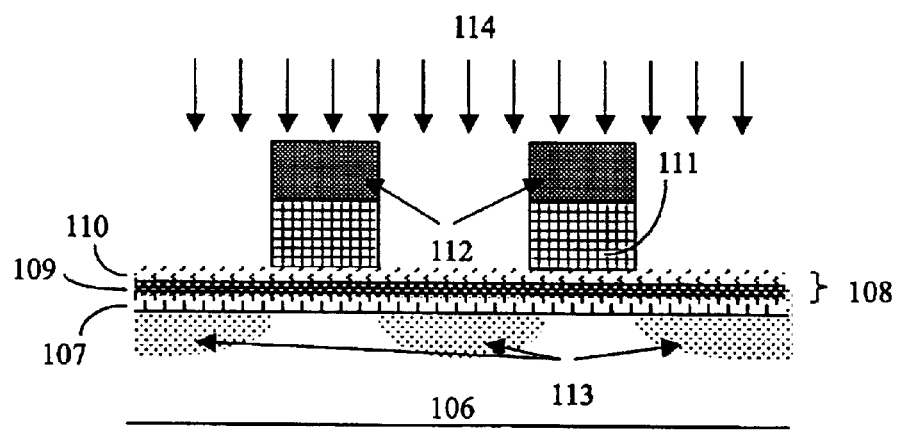
FIG. 4 shows a result of barrier diffusion (BDF) implantation over the structure illustrated in FIG. 3.

Referring to FIG. 3, the first sacrificial layer 111 is etched with the patterned protective patterning layer 112 as mask The etching process is preferably a dry etching process, for example a RIB plasma etching process with chlorine ($Cl_2$), hydrogen bromide (HBr) and oxygen ($O_2$) plasma Referring to FIG. 4, the buried diffusion implant (BDF) regions 113 are formed in the semiconductor substrate 106 by implanting ions over the structure illustrated in FIG. 3. The ions can be either n-type or p-type impurities 114 implanted with energies in the range of about 20 to about 150 KeV, and a dosage in the range of about $0.5 \times 10^{14}$ to about $2 \times 10^{18}$ atoms/$cm^2$. The ion impurity is preferably Arsine in this preferred embodiment. It will be appreciated that this is a self-aligned implant in which the bit lines are self-aligned to the substrate 106.

Figure 5:
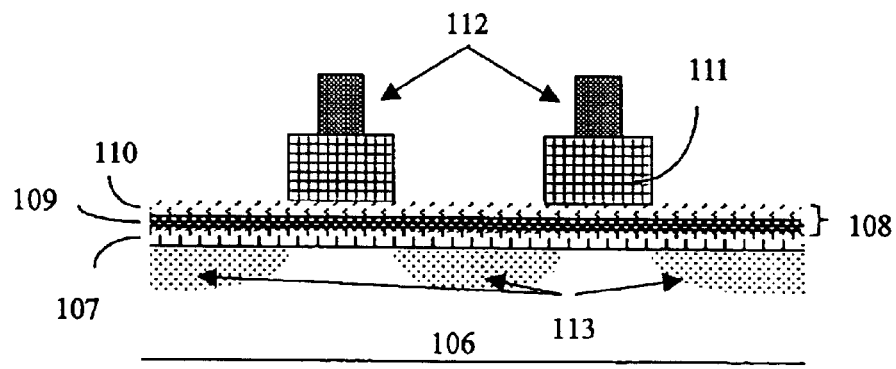
FIG. 5 shows a result of trimming the photoresist.

Referring to FIG. 5, the protective patterning layer 112 is trimmed by using a conventional etching process, and preferably a dry etching process. The dry etching process gases include Fluorine-based gas, carbon monoxide (CO) and $O_2$ plasma. In this preferred embodiment, the process gases are $CF_4$ and $O_2$.

Figure 6:
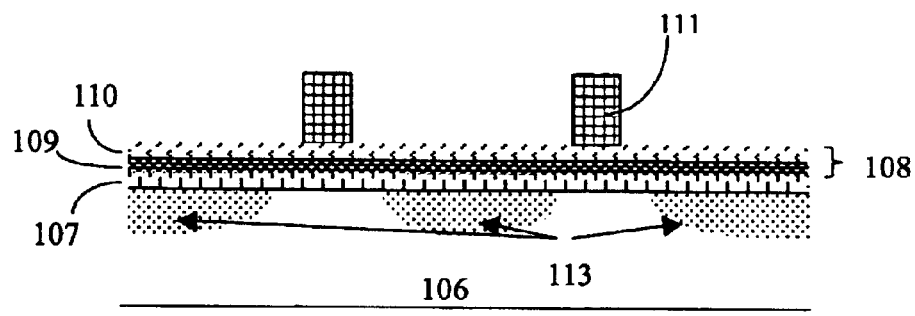
FIG. 6 shows a result of patterning the polysilicon layer shown in FIG. 5.

As shown in FIG. 6, the first sacrificial layer 111 is etched by using the protective pattering layer 112 illustrated in FIG. 5 as mask. The etching process is preferably a dry etching process, for example, a RIE plasma etching process with $Cl_2$, HBr and $O_2$ plasma.

Figure 7:
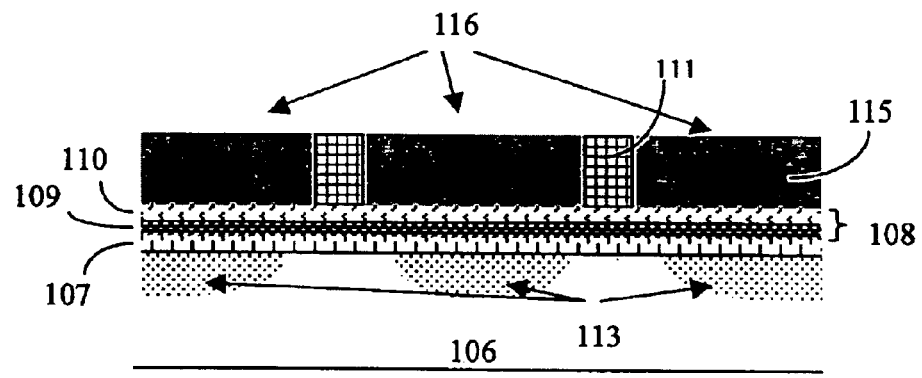
FIG. 7 shows a result of filling a nitride layer in the opening of the patterned polysilicon layer.

Referring to FIG. 7, a second sacrificial layer 115 is filled in the openings 116 illustrated in FIG. 6. The second sacrificial layer is preferably a silicon nitride layer formed by a conventional CVD process, and preferably a LPCVD process. The precursors of the low pressure chemical vapor deposition process are dichlorosilane ($SiCl_2H_2$), silane ($SiH_4$) and ammonia ($NH_3$).

Figure 8:
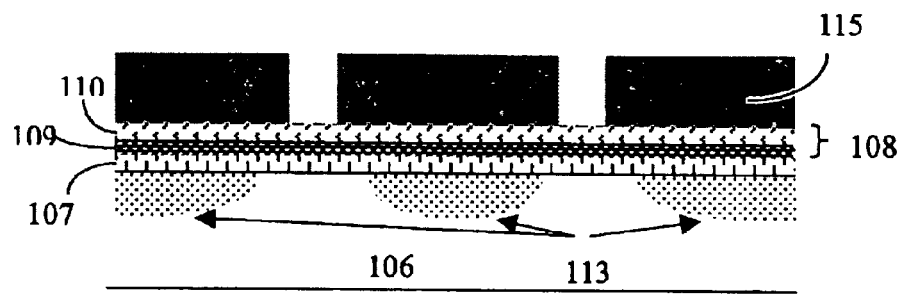
FIG. 8 shows a result of removing the polysilicon layer.

As FIG. 8 shows, the first sacrificial layer 111 is removed by using a conventional etching process. The etching process is preferably a dry etching process that use $Cl_2$, HBr and $O_2$ plasma.

Figure 9:
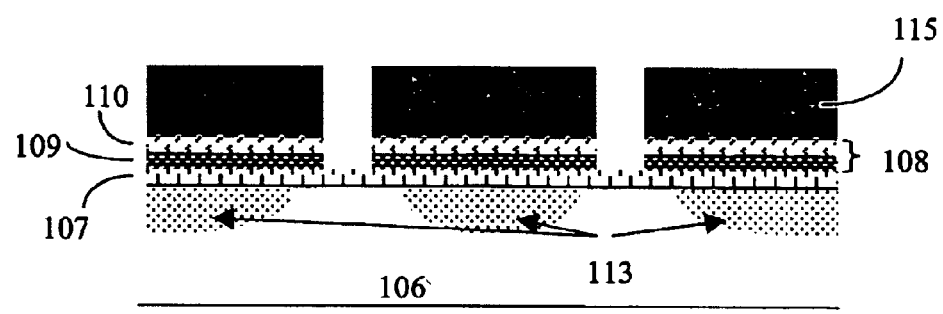
FIG. 9 shows a result of removing the oxide-nitride composite layer.

Referring to FIG. 9, the insulating composite layer 108 is removed by using the second sacrificial layer 115 illustrated in FIG. 8 as mask, thereby exposing the dielectric layer 107. Preferably dry etching is used in this step, with different etching selectivity between the composite layer 108 and the tunnel oxide layer 107. Materials such as $CHF_3$, $CF_4$, HBr and $SF_6$ can be used. It is acceptable if some amount of the tunnel oxide layer 107 is also removed in this step, as long as the amount is controlled. Importantly, it can be seen that isolated ONO segments are formed by self-aligned etching of the insulating composite layer without using any photolithographic process.

Figure 10:
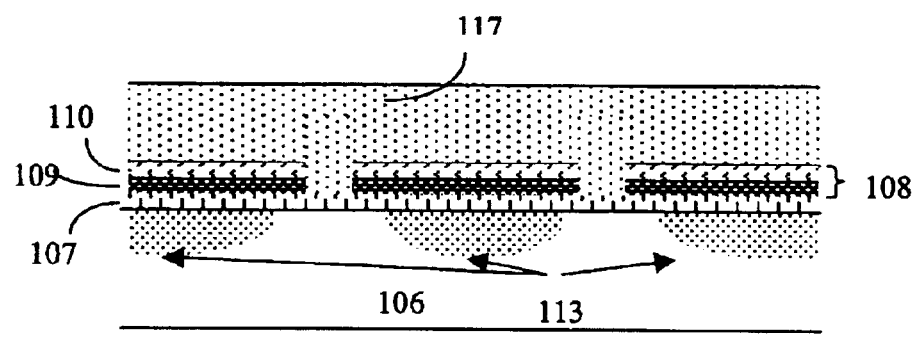
FIG. 10 shows a result of forming a control gate.

As shown in FIG. 10, the second sacrificial layer 115 is removed by using a conventional etching process and a control gate 117 is formed. The control gate is preferably a polysilicon gate.

As used herein, the terms "above" and "below" are intended to be interpreted relative to the substrate as a base. Similar interpretations are intended for the words "overlying", "underlying" and "superposing". In addition, as used herein, a "layer" can include "sub-layers", each of which can itself also be considered herein to constitute a "layer".

Other embodiments of the invention will appear to those skilled in the art form consideration of the specification and practice of the invention disclosed herein. It is to be understood that the present invention is capable of use in various other combinations and environments and is capable of changes or modification within the scope of the inventive concept as expressed herein.

What is claimed is:

1. A fabrication method for a non-volatile memory device, said method comprising:

providing a semiconductor substrate comprising a dielectric layer formed on thereon, an insulating composite layer formed on said dielectric layer;

forming a patterned protective patterning layer and a patterned first sacrificial layer on said insulating composite layer;

using at least said first patterned sacrificial layer as mask, introducing impurities into said substrate;

trimming said protective patterning layer;

patterning said first sacrificial layer by using said protective patterning layer as masks, wherein said first sacrificial layer comprises an opening that exposes said insulating composite layer;

removing said protective patterning layer;

filling a second sacrificial layer in said opening of said first sacrificial layer;

patterning said first sacrificial layer and said insulating composite layer by using said second sacrificial layer as masks and exposing said dielectric layer;

removing said second sacrificial layer; and forming a control gate on said composite layer.

2. The method according to claim 1, wherein said dielectric layer is a silicon dioxide layer.

3. The method according to claim 1, wherein said insulating composite layer is formed of a silicon dioxide layer and a silicon nitride layer.

4. The method according to claim 1, wherein said first sacrificial layer a polysilicon layer.

5. The method according to claim 1, wherein said second sacrificial layer is a silicon nitride layer.

6. The method according to claim 1, wherein said control gate is a polysilicon gate.

7. The method according to claim 1, wherein said protective patterning layer is a photoresist layer.

8. A method for making a twin bit cell memory device, comprising the steps of:

forming on a substrate a tunnel dielectric layer, an insulating charge-trapping layer overlying the tunnel dielectric layer, and a second dielectric layer overlying the charge-trapping layer;

forming on said substrate a first patterned sacrificial material overlying said second dielectric layer;

using at least said first patterned sacrificial material as a mask, introducing impurities into said substrate;

filling openings in said first patterned sacrificial material with a second sacrificial material;

removing said first patterned sacrificial material to expose portions of said second dielectric layer through said second sacrificial material;

using said second sacrificial material as a mask, opening through-holes in said exposed portions of said second dielectric layer and portions of said charge-trapping layer underlying said exposed portions of said second dielectric layer;

removing said second sacrificial material; and forming control gates overlying said second dielectric layer and extending over said through-holes.

9. A method according to claim 8, further comprising the step of widening said openings in said first patterned sacrificial material after said step of introducing impurities and before said step of filling openings in said first patterned sacrificial material.

10. A method according to claim 9, wherein said first patterned sacrificial material comprises a first sublayer of sacrificial material and a photoresist superposing said first sublayer of sacrificial material, and wherein said step of widening said openings comprises the steps of:

trimming said photoresist; and using said photoresist as a mask, re-patterning said first sublayer of sacrificial material.

11. A method according to claim 8, wherein said control gates formed in said step of forming control gates also fill said through-holes.

12. A method according to claim 8, wherein said tunnel dielectric layer comprises silicon dioxide.

13. A method according to claim 8, wherein said second dielectric layer comprises silicon dioxide and said charge-trapping layer comprises silicon nitride.

14. A method according to claim 8, wherein said first sacrificial material comprises polysilicon.

15. A method according to claim 8, wherein said second sacrificial material comprises silicon nitride.

16. A method according to claim 8, wherein said control gates comprise polysilicon.

* * * * *